US008060040B2

(12) United States Patent
Arnborg

(10) Patent No.: US 8,060,040 B2
(45) Date of Patent: Nov. 15, 2011

(54) TRUE ROOT-MEAN-SQUARE DETECTION WITH A SUB-THRESHOLD TRANSISTOR BRIDGE CIRCUIT

(75) Inventor: Torkel Arnborg, Stockholm (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 633 days.

(21) Appl. No.: 12/193,230

(22) Filed: Aug. 18, 2008

(65) Prior Publication Data
US 2010/0041356 A1    Feb. 18, 2010

(51) Int. Cl.
| H04B 1/16 | (2006.01) |
| H04B 17/00 | (2006.01) |
| H04B 1/06 | (2006.01) |
| H04B 7/00 | (2006.01) |
| H04B 1/08 | (2006.01) |

(52) U.S. Cl. ............... 455/130; 455/214; 455/226.1; 455/263; 455/333; 455/336

(58) Field of Classification Search .......... 455/214, 455/224, 226.1–226.4, 263, 281, 296, 298–303, 455/333, 336–337
See application file for complete search history.

(56) References Cited

U.S. PATENT DOCUMENTS

| 3,321,707 | A |   | 5/1967 | Brownell |            |
|-----------|---|---|--------|----------|------------|
| 4,485,348 | A |   | 11/1984| Perkins  |            |
| 4,647,848 | A |   | 3/1987 | Barrett  |            |
| 4,727,297 | A | * | 2/1988 | Wolze    | 315/307    |
| 5,003,271 | A | * | 3/1991 | Swanson  | 330/298    |
| 5,276,910 | A | * | 1/1994 | Buchele  | 455/41.1   |
| 6,072,362 | A | * | 6/2000 | Lincoln  | 330/10     |
| 6,094,021 | A | * | 7/2000 | Noro et al. | 318/400.29 |
| 6,278,872 | B1| * | 8/2001 | Poulin et al. | 455/333 |
| 6,294,957 | B1| * | 9/2001 | Luu      | 330/251    |
| 6,380,807 | B1| * | 4/2002 | Brokaw   | 330/258    |
| 6,649,985 | B1|   | 11/2003| Nishimoto et al. |    |
| 6,683,471 | B2|   | 1/2004 | Ratni et al. |        |
| 6,844,658 | B2| * | 1/2005 | Hoshino  | 310/316.03 |

(Continued)

FOREIGN PATENT DOCUMENTS

DE    4132257 A1    4/1993

(Continued)

OTHER PUBLICATIONS

Xu et al., "Low Frequency Pulsed Resonant Converter for Energy Harvesting," IEEE Transactions on Power Electronics, Jan. 2007, pp. 63-68, vol. 22, No. 1, IEEE Service Center, Piscataway, NJ.

(Continued)

*Primary Examiner* — Simon Nguyen
(74) *Attorney, Agent, or Firm* — Coats & Bennett, PLLC

(57) ABSTRACT

A sub-threshold transistor bridge circuit for use in detecting the signal level of an input radio-frequency signal is disclosed. In an exemplary embodiment each branch of the sub-threshold transistor bridge circuit comprises a transistor configured to operate in the sub-threshold region over a predetermined range of input signal levels. An input radio-frequency signal applied to a first pair of opposing corners of the bridge circuit yields a bridge output signal at the remaining pair of opposing corners that has a low-frequency component substantially proportional to the squared-amplitude of the envelope of the input radio-frequency signal. Also disclosed are various detector circuits including a sub-threshold transistor bridge circuit, as well as methods for detecting a signal level for an radio-frequency signal using a sub-threshold transistor bridge.

12 Claims, 8 Drawing Sheets

U.S. PATENT DOCUMENTS

| | | | |
|---|---|---|---|
| 6,847,808 B2 | 1/2005 | Zhou | |
| 7,049,855 B2 | 5/2006 | Soumyanath et al. | |
| 7,092,269 B1* | 8/2006 | Westberg | 363/132 |
| 7,397,676 B2* | 7/2008 | Lincoln et al. | 363/56.01 |
| 7,512,422 B2* | 3/2009 | Coleman | 455/572 |
| 7,638,952 B2* | 12/2009 | Suzuki | 315/274 |
| 7,786,720 B2* | 8/2010 | Arnborg | 324/120 |
| 2006/0128345 A1 | 6/2006 | Ootaka et al. | |
| 2007/0030064 A1 | 2/2007 | Yu | |
| 2007/0087719 A1* | 4/2007 | Mandal et al. | 455/299 |
| 2007/0270922 A1 | 11/2007 | Zierhofer et al. | |

FOREIGN PATENT DOCUMENTS

| | | |
|---|---|---|
| WO | 2007/027885 A2 | 3/2007 |
| WO | 2007/131187 A2 | 11/2007 |

OTHER PUBLICATIONS

Lee, H et al. "A 500 μW 2.4 GHz CMOS Subthreshold Mixer for Ultra Low Power Applications." 2007 IEEE Radio Frequency Integrated Circuits Symposium, Jun. 3-5, 2007, pp. 325-328.

Lopez-Martin, A. J. et al. "A Current-Mode CMOS RMS-DC Converter for Very Low-Voltage Applications." The 8th IEEE International Conference on Electronics, Circuits and Systems, 2001. Malta, Sep. 2-5, 2001, pp. 425-428.

Yin, Q. et al. "A Translinear-Based RF RMS Detector for Embedded Test of RF ICs." IEEE Transactions on Instrumentation and Measurement, vol. 54, No. 5, Oct. 2005, pp. 1708-1714.

Milanovic, V. et al. "MOS Foundry Implementation of Schottky Diodes for RF Detection." IEEE Transactions on Electron Devices, vol. 43, No. 12, Dec. 1996, pp. 2210-2214.

Kimura, K. "A CMOS Logarighmic IF Amplifier with Unbalanced Source-Coupled Pairs." IEEE Journal of Solid-State Circuits, vol. 28, No. 1, Jan. 1993, pp. 78-83.

Huang, P.-C. et al. "A 2-V 10.7-Mhz CMOS Limiting Amplifier/RSSI." IEEE Journal of Solid-State Circuits, vol. 35, No. 10, Oct. 2000, pp. 1474-1480.

Jonsson, F. et al. "RF Detector for On-Chip Amplitude Measurements." Electronics Letters, vol. 40, No. 20, Sep. 30, 2004.

Arnborg, T. "Passive Mixer Power Detector Method and Apparatus." Co-pending U.S. Appl. No. 12/146,904, filed Jun. 26, 2008.

* cited by examiner

TRUE ROOT-MEAN-SQUARE DETECTION WITH A SUB-THRESHOLD TRANSISTOR BRIDGE CIRCUIT

The present invention generally relates to power detectors, and more particularly relates to detecting the power level or true root-mean-square level of a radio frequency (RF) signal.

BACKGROUND

Radio-frequency detectors, which include devices that can sense a voltage level, current level, or power level of a radio-frequency (RF) signal, are used in radio applications for a variety of purposes. For example, an RF detector may be used to measure output power from a transmitter power amplifier, or to estimate the signal strength of a received signal.

A simple envelope detector might comprise just a diode and capacitor, or a four diode bridge rectifier. A diode used for power detection applications is typically a junction diode (such as a Schottky diode), fabricated with standard CMOS process technology. These junction diodes exhibit large forward voltage drops and poorly controlled operating parameters, limiting the dynamic range and accuracy of diode-based detectors.

RF detectors may also be constructed by exploiting the quadratic operating characteristic of a transistor, such as a MOSFET. One approach exploits the quadratic relationship between input voltage and output current of a single softly saturated FET, followed by a low-pass filter. Power detectors based on softly saturated amplifiers have a broader dynamic range than a simple diode-based detector, but consume more area. These power detectors also have a relatively low upper frequency limit.

Another well-known approach is to use an unbalanced pair of transistors as a rectifying signal detector. Unbalanced-pair power detectors are less sensitive to temperature than single-diode or single-transistor designs, but have a fundamental built in DC-offset voltage that limits dynamic range. To improve dynamic range, received-signal-strength indicator (RSSI) circuits often use unbalanced transistor pairs coupled to a series of limiting amplifiers. Other circuits extend the dynamic range of a detector by using a variable-gain amplifier, with feed-back loops, to amplify the RF signal so that it falls within the limited dynamic range of the detector. Of course, either of these approaches to improving dynamic range requires larger and more complicated circuits, and more demanding attention to design details, especially as the desired operating frequency approaches the cut-off frequency for the available semiconductor technology.

Simple current- or voltage-rectifier detector circuits are generally followed by a filter, to provide a smooth DC (or low-frequency) output. The output of such a filter is proportional to the average value of the AC input signal. For waveforms of a known shape, such as a sine wave, this output provides all the information that is needed, since the relationship between the average value and other parameters, such as peak value or root-mean-square (RMS) value is known. However, in some applications a direct measurement of RMS power may be desired, even for complex waveforms where the relationship between the average level and RMS level is unknown. Some power detector circuits that rely on the quadratic characteristic of a transistor enable RMS detection. For example, the unbalanced-pair detector discussed above effectively performs a squaring operation, based on a sensed input voltage, along with a rectification operation, thus yielding an output proportional to the power of the input signal. An RMS value may be obtained by taking the square root of the average power. Detectors that yield an output proportional to the RMS level of the input signal are known as true RMS detectors.

SUMMARY

A sub-threshold transistor bridge circuit, which may be used in an extended-range true RMS detector circuit, comprises four branches, each branch comprising a transistor configured to operate in the sub-threshold region over a pre-determined range of input signal levels. In some embodiments, the transistors have a low or negligible threshold voltage, and the gate of each transistor is DC-coupled to the gate of the transistor on the opposite branch. In other embodiments, the transistors are actively biased to operate at a desired operating point in the sub-threshold region for the desired range of input signal levels, and the gate of each transistor is AC-coupled to the gate of the transistor on the opposite branch. In each of these embodiments, an input radio-frequency signal applied to a first pair of opposing corners of the bridge circuit yields a bridge output signal at the remaining pair of opposing corners that has a low-frequency component substantially proportional to the squared-amplitude of the envelope of the input radio-frequency signal.

In some embodiments, a detector circuit including a sub-threshold transistor bridge circuit further comprises a DC-to-radio-frequency converter circuit configured to convert the bridge output signal to a second radio-frequency signal having an amplitude proportional to the bridge output signal level and a substantially linear radio-frequency amplifier configured to amplify the second radio-frequency signal with a pre-determined gain. These embodiments further comprise a rectifier circuit configured to convert the amplified second radio-frequency signal to a low-frequency detected signal proportional to the envelope of the amplified second radio-frequency signal.

In various of these embodiments, the DC-to-radio-frequency converter circuit comprises a frequency mixer circuit configured to mix the bridge output signal with a local oscillator signal to obtain the second radio-frequency signal, the local oscillator signal having a center frequency that differs from the center frequency of the input radio-frequency signal. Other embodiments include a limiting amplifier configured to amplify the input radio-frequency signal to obtain an amplitude-limited radio-frequency signal, and the DC-to-radio-frequency converter circuit comprises a frequency mixer circuit configured to mix the bridge output signal with the amplitude-limited radio-frequency signal to obtain the second radio-frequency signal.

Some embodiments of a detector circuit including a sub-threshold transistor bridge circuit further include an analog-to-digital converter configured to convert the low-frequency detected signal to a sampled power level signal, and a digital processing circuit configured to calculate the square root of the sampled power level signal to obtain a sampled true root-mean-square signal.

Various methods, generally corresponding to the circuits disclosed herein, are also disclosed. In an exemplary embodiment, a method of detecting a signal level of a radio-frequency signal comprises applying an input radio-frequency signal to a first pair of opposing corners of a sub-threshold transistor bridge circuit, each of the four branches of the bridge comprising a transistor configured to operate in the sub-threshold region over a predetermined range of input signal levels. The method further comprises detecting a signal level for the input radio-frequency signal based on a bridge output signal taken at the remaining pair of opposing corners of the bridge circuit, the bridge output signal having a low-frequency component substantially proportional to the squared-amplitude of the envelope of the input radio-frequency signal Of course, the present invention is not limited to the above features and advantages. Those skilled in the art will recognize additional features and advantages upon reading the following detailed description, and upon viewing the accompanying drawings.

DETAILED DESCRIPTION

Figure 1:
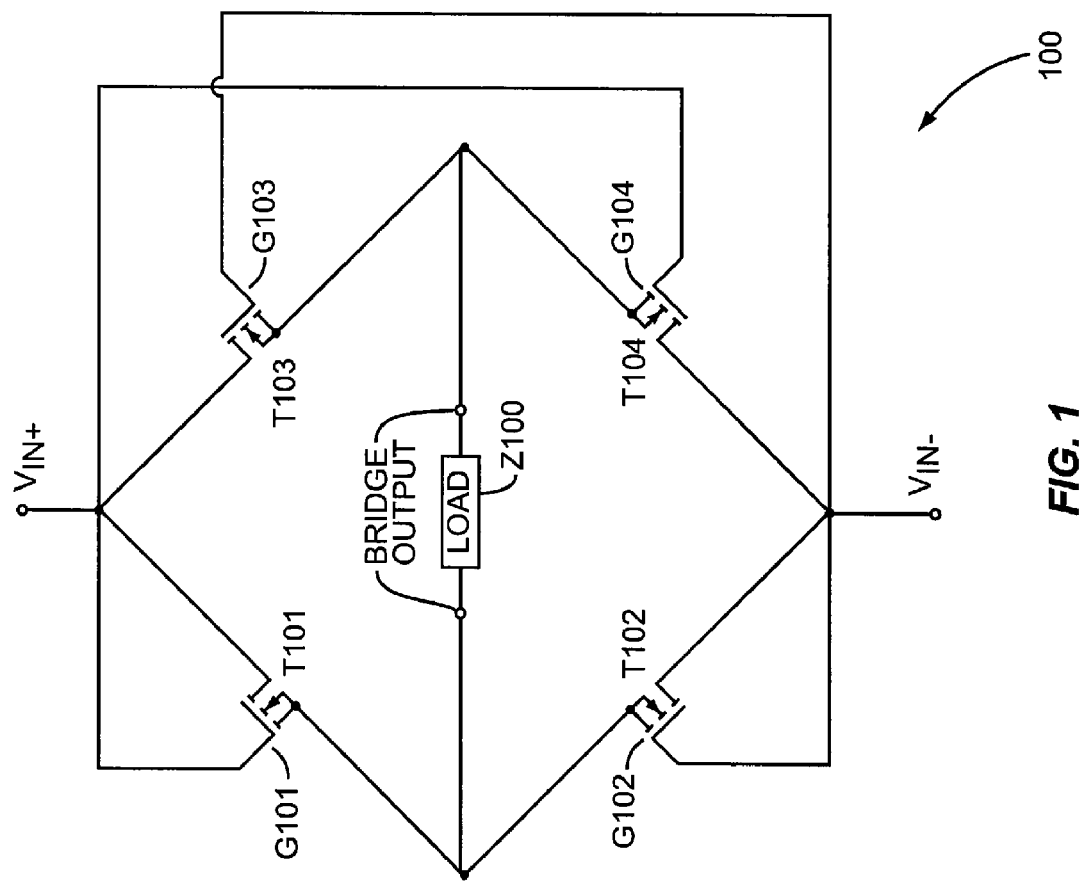
FIG. 1 is a schematic diagram of a detector circuit comprising a sub-threshold transistor bridge circuit according to some embodiments of the invention.

FIG. 1 is a schematic diagram of a sub-threshold transistor bridge circuit 100 according to some embodiments of the present invention. Bridge circuit 100 comprises four branches, each branch comprising a transistor configured for operation in the sub-threshold region over a pre-determined range of input signal levels. The gate of each transistor T101-T104 is DC-coupled to the gate of the transistor on the opposite branch. Thus, gate G101 is coupled to G104, and gate G102 is coupled to G103. As will be explained in more detail below, an input radio-frequency (RF) signal applied to a first pair of opposing corners of bridge circuit 100, at terminals $V_{IN+}$ and $V_{IN-}$, yields a bridge output signal at the remaining pair of opposing corners that has a low-frequency component substantially proportional to the squared-amplitude of the envelope of the input RF signal.

Those practitioners skilled in radio-frequency circuit design will recognize that the sub-threshold transistor bridge circuit has a topology that is somewhat similar to that of a passive mixer, but without complementary pairs. However, the operating principle of this circuit, as will be described in detail below, is quite different. The sub-threshold transistor bridge circuit effectively rectifies an input radio-frequency (RF) signal and generates an output time-varying DC signal that is proportional to the square of the input signal. ("DC signal" as used in this context, simply means a low frequency signal that tracks the level of the input RF signal. Thus, in this context, "DC" includes near-DC signals, and does not indicate that the signal is absolutely constant and non-varying.)

Thus, the most challenging part of the necessary operations to obtain an RMS value for the input RF signal is performed, i.e.:

$$U_{RMS}^2 = \frac{1}{T}\int_0^T u^2(t)\,dt. \qquad (1)$$

When an input voltage applied between the $V_{IN+}$ and $V_{IN-}$ terminals of the sub-threshold transistor bridge circuit of FIG. 1 is positive, then field-effect transistors T101 and T104 conduct, and a current flows across the bridge output, through load Z100. When the input voltage changes sign, then transistors T102 and T103 are turned on. There is thus a rectifying process where the load Z100 receives current in response to the input radio-frequency signal in such a manner that the current flow through the circuit load is unidirectional. When the circuit of FIG. 1 is employed as a detector circuit, transistors T101-104 operate in the sub-threshold region over a pre-determined range of input signal levels, resulting in a output current that is proportional to the squared-amplitude of the envelope of the input RF signal applied to $V_{IN+}$ and $V_{IN-}$.

Figure 2:
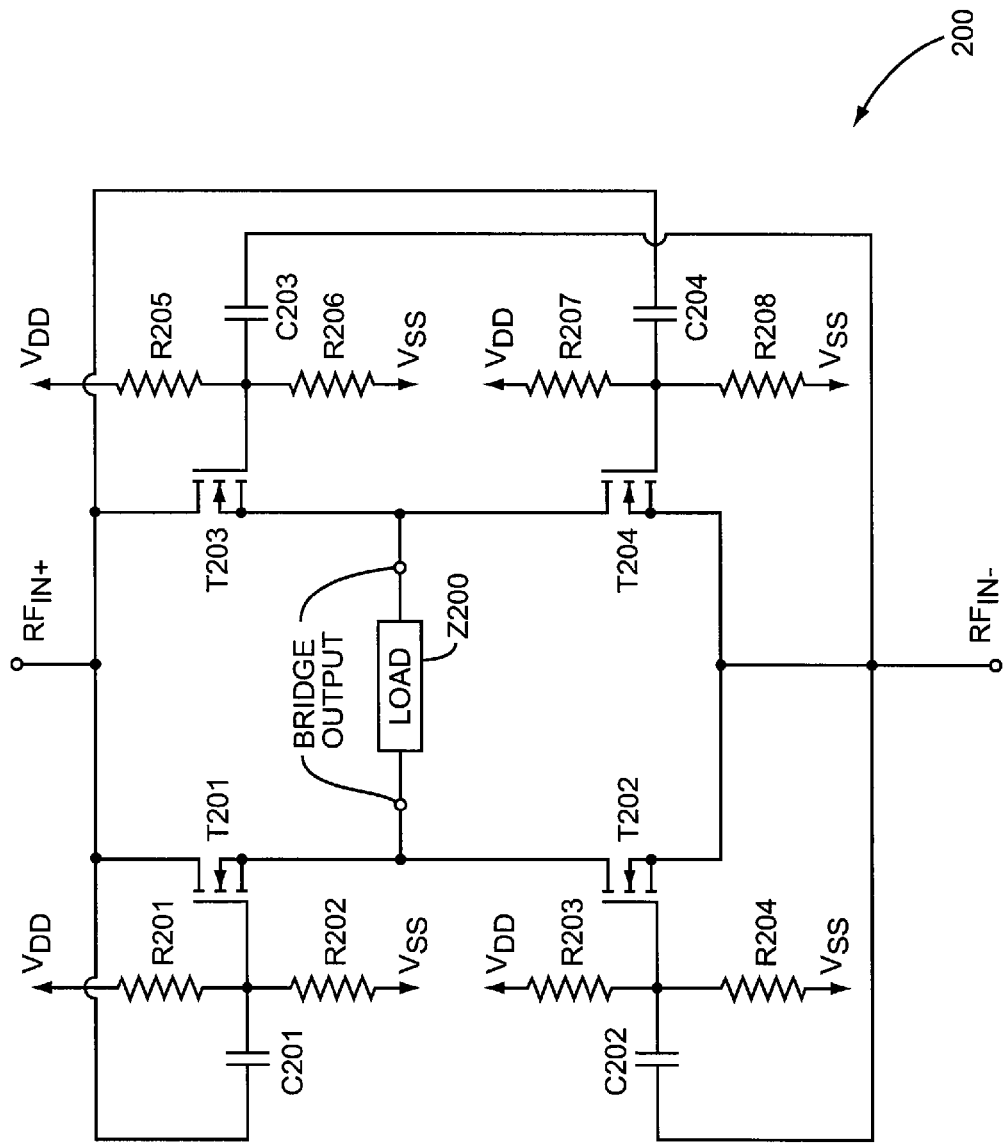
FIG. 2 is a schematic diagram illustrating another embodiment of a sub-threshold transistor bridge circuit.

Obtaining an adequate current response from the sub-threshold bridge circuit over an expected range of input signal levels may be ensured in some embodiments by using low- or zero-threshold voltage transistors that are available in any modern CMOS process. An alternative solution is shown in the circuit of FIG. 2, where each transistor of the sub-threshold transistor bridge circuit 200 is actively biased, using resistors R201-R208. In the circuit of FIG. 1, the gate of each transistor is DC-coupled to the gate of the transistor on the opposite branch of the bridge. In the circuit of FIG. 2, the gate of each transistor is AC-coupled to the gate of the transistor on the opposite branch of the bridge, through coupling capacitors C201-208.

The biasing approach illustrated in FIG. 2 makes it possible to use transistors with standard threshold voltages, while optimizing the extent of sub-threshold operation that is desired. Those skilled in the art will appreciate that various biasing configurations may be employed to bias the transistors of a sub-threshold transistor bridge at a desired sub-threshold operating point; thus, the circuit pictured in FIG. 2 is intended to be merely illustrative, and not limiting. Furthermore, although the schematic diagrams of FIG. 1 and FIG. 2 illustrate enhanced-mode n-channel MOSFETs, those skilled in the art will appreciate that similar circuits, with equivalent operation, may be assembled using transistors of different types.

In any event, in the circuit of FIG. 2, transistors T101 and T103, as well as T102 and T104, will conduct simultaneously. However, the current through load Z200 remains unidirectional, with a low-frequency (i.e., near-DC) component that is substantially proportional to the squared-amplitude of the envelope of the input radio-frequency signal. This can be seen by analysis of the circuit of FIG. 8, which, exploiting the symmetry of the circuits of FIGS. 1 and 2, models the currents of the sub-threshold transistor bridge circuit.

In general, the sub-threshold current of a MOS field-effect transistor can be described by $$I_{DS} = I_0\left[1 - \exp\left(\frac{V_{DS}}{V_{thermal}}\right)\right]\cdot\exp\left(\frac{V_{GS} - V_T}{\eta V_{thermal}}\right), \qquad (2)$$

where $I_0$ is the sub-threshold current at $V_{GS}=V_T$, $V_{thermal}$ is the thermal voltage, $\eta$ is the sub-threshold slope factor (inversely related to the sub-threshold swing), and $V_T$ is the transistor threshold voltage. The drain voltage dependence of Equation (2), which can be derived from basic semiconductor physics, reflects a diffusion type of current originating from a bipolar action in the MOS-transistor, and is consistent with experimentally verified simulation models for currently used semiconductor processes.

Figure 8:
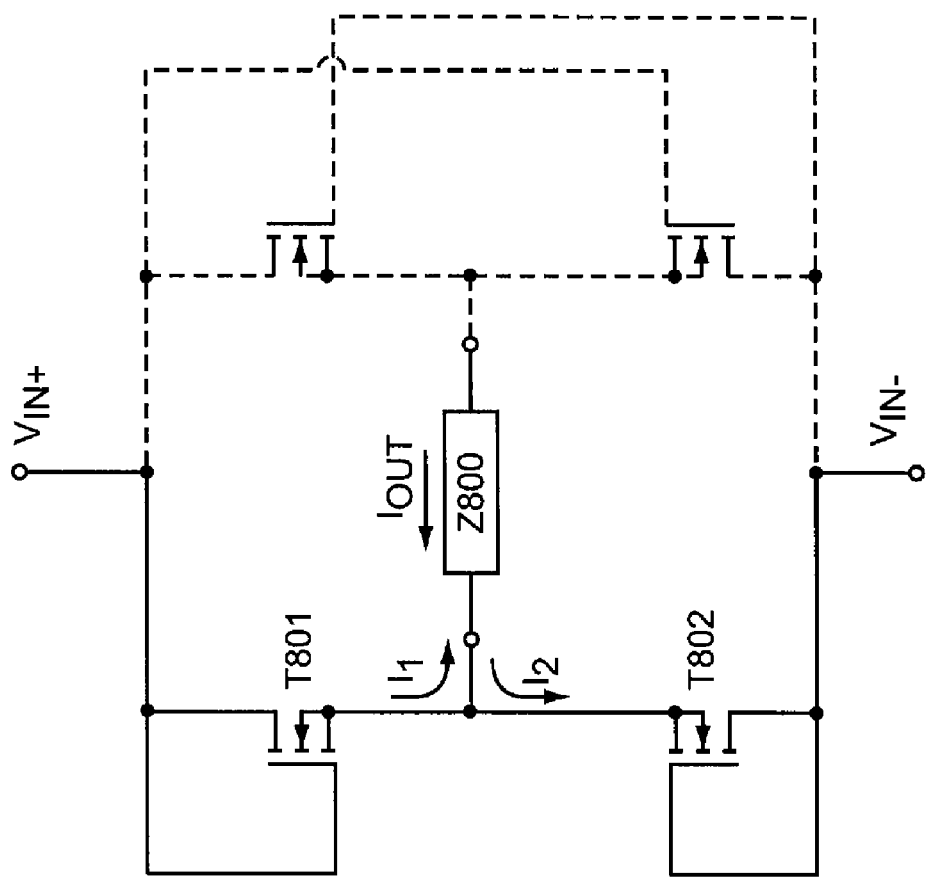
FIG. 8 illustrates current flows in a model of a sub-threshold transistor bridge circuit.

The sub-threshold currents in the transistor bridge can be modeled as shown in FIG. 8, where the current through T801 can be shown to be:

$$I_1 = I_0 \left[ 1 - \exp\left(\frac{V_{IN}}{2V_{thermal}}\right)\right] \cdot \exp\left(\frac{\frac{1}{2}V_{IN} - V_T}{\eta V_{thermal}}\right), \quad (3)$$

where $V_{IN}$ is the amplitude of the input voltage between $V_{IN+}$ and $V_{IN-}$. Similarly, the current through T802 can be shown to be:

$$I_2 = I_0 \left[1 - \exp\left(\frac{V_{IN}}{2V_{thermal}}\right)\right] \cdot \exp\left(\frac{-V_T}{\eta V_{thermal}}\right). \quad (4)$$

Assuming that the input voltage is smaller than the thermal voltage, the currents may be expanded using a Taylor series, and the total current through the load Z800 then expressed as:

$$I_{OUT} = I_2 - I_1 = I_0 \cdot \exp\left(\frac{-V_T}{\eta V_{thermal}}\right) \cdot \frac{V_{IN}^2}{4V_T V_{thermal}}. \quad (5)$$

Those skilled in the art will appreciate that there is a significant difference between this current, as represented in Equation (5), and the current that arises from the non-linearity of a single semiconductor device, such as a single diode or transistor. As can be seen from the above analysis, the difference operation between the currents in T801 and T802 cancels the constant and linear terms, thus removing offset voltages that arise in other detectors based on quadratic non-linearities. The result is that the useful region of operation for the sub-threshold transistor bridge circuit is considerably larger than for conventional quadratic detectors.

Those skilled in the art will also appreciate that the bridge output signal discussed above is very small, due to the sub-threshold operation of the bridge transistors. In some embodiments of the invention, the signal is thus amplified to useful levels by converting the low-frequency bridge output signal back to an RF signal, and then amplifying the new RF signal using AC-coupled amplifiers. This approach avoids DC offset problems that would arise from amplifying the DC bridge output signal directly.

Figure 3:
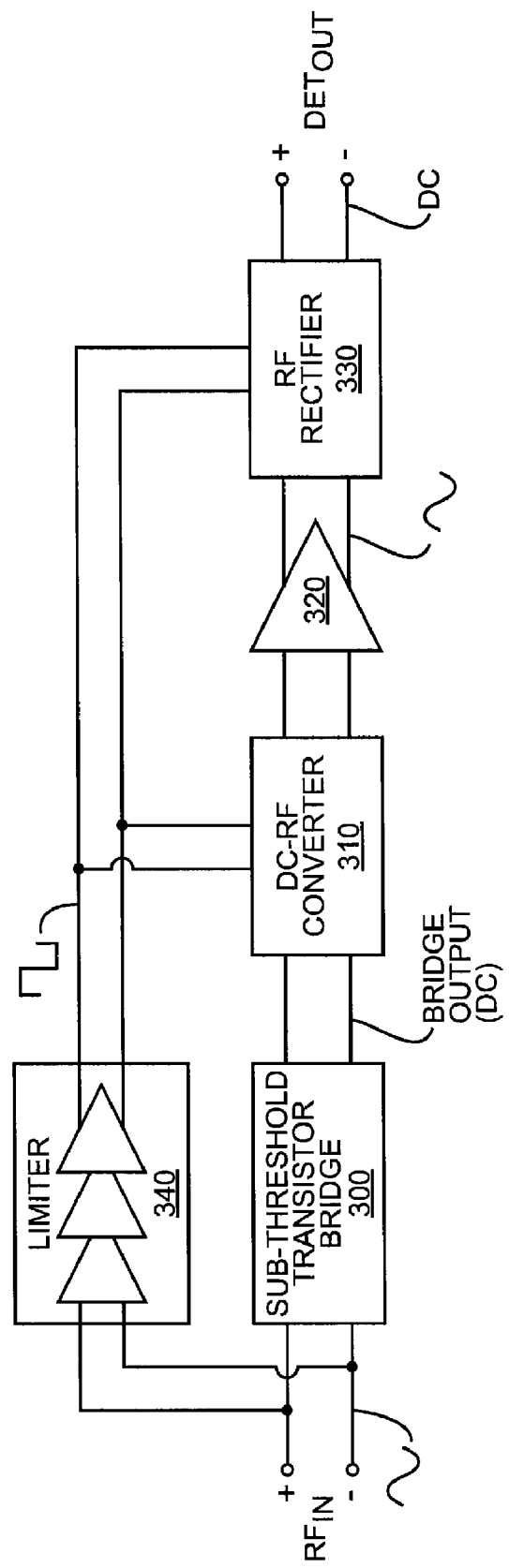
FIG. 3 is a block diagram of an exemplary power detector circuit.

A block diagram illustrating this general approach is provided in FIG. 3. A sub-threshold transistor bridge circuit 300, which may be either of the circuits illustrated in FIGS. 1 or 2, or equivalents thereof, is followed by a DC-RF converter circuit 310, which converts the bridge output signal from a low-frequency (near-DC) signal to a second RF signal, which has an amplitude proportional to the bridge output signal level. The second RF signal output from DC-RF converter 310 is amplified by amplifier 320, which is a conventional linear RF amplifier. The gain of amplifier 320 is selected to amplify the bridge output signal from bridge 300 to a level more suitable for conventional detection by RF rectifier circuit 330, which converts the amplified signal output from amplifier 320 into a low-frequency (near-DC) signal that is proportional to the envelope of the amplified second radio-frequency signal. Accordingly, the precise gain and configuration of amplifier 320 depends on the expected range for the bridge output signal, given a desired input operating range. In some cases, more than one gain stage may be needed in amplifier 320 to achieve the desired gain.

As will be discussed in more detail below, the DC-RF converter 310 in the detector circuit of FIG. 3 may comprise a mixer circuit configured so that the DC (or near-DC) bridge output signal is mixed with a local oscillator (LO) signal at a second radio frequency to obtain an RF output, also at the second radio frequency. In this configuration, the level of the RF output is determined by the bridge output signal level. In the configuration of FIG. 3, the LO signal is generated from the input RF signal, by applying the input RF signal to a limiting amplifier 340. The output of limiting amplifier 340 is voltage limited, so that the output amplitude does not vary appreciably over the expected range of input RF signal levels. This ensures that the output level of DC-RF converter 310 depends directly on the bridge output signal level, and is not affected by variations in the LO signal level.

The same amplitude-limited signal is also used in FIG. 3 to provide a switching input to RF rectifier 330. An exemplary embodiment of rectifier circuit 330 is provided in FIG. 6, and discussed below.

Figure 4:
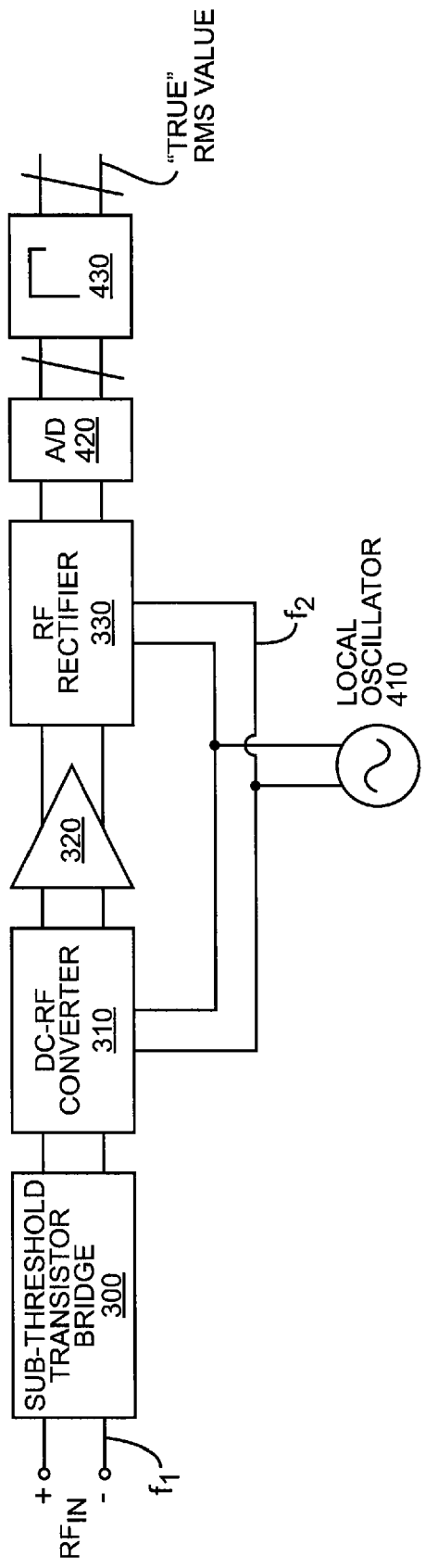
FIG. 4 is a block diagram illustrating an embodiment of a true RMS detector circuit according to some embodiments of the invention.

An alternative approach to driving DC-RF converter 310 and RF rectifier circuit 330 is illustrated in FIG. 4. In this detector circuit configuration, the LO signal driving DC-RF converter 310 and rectifier 330 is provided by local oscillator circuit 410 which may comprise, for example, a conventional ring oscillator or other radio-frequency signal source. An advantage of this configuration is that the frequency of the second radio frequency signal, $f_2$, may be selected to differ from the frequency of the input RF signal. In some embodiments, $f_2$ may be considerably lower than the input signal frequencies, potentially simplifying the design of DC-RF converter 310, linear amplifier 320, and/or RF rectifier 330.

FIG. 4 illustrates two additional stages that might be included in detector circuits according to some embodiments of the present invention. In particular, RF rectifier 330 is followed by analog-to-digital converter (A/D) 420, which converts the low-frequency output of RF rectifier 330 into a sampled digital signal. Because of the squaring operation of sub-threshold transistor bridge 300, the output of A/D 420 is effectively a sampled power level signal, proportional to the power level of the input RF signal. This sampled power level signal is converted to a "true" RMS value using a square-root circuit 430, which may comprise a look-up table accessible to a suitably programmed microprocessor, or other conventional means for calculating a square-root value.

Figure 5:
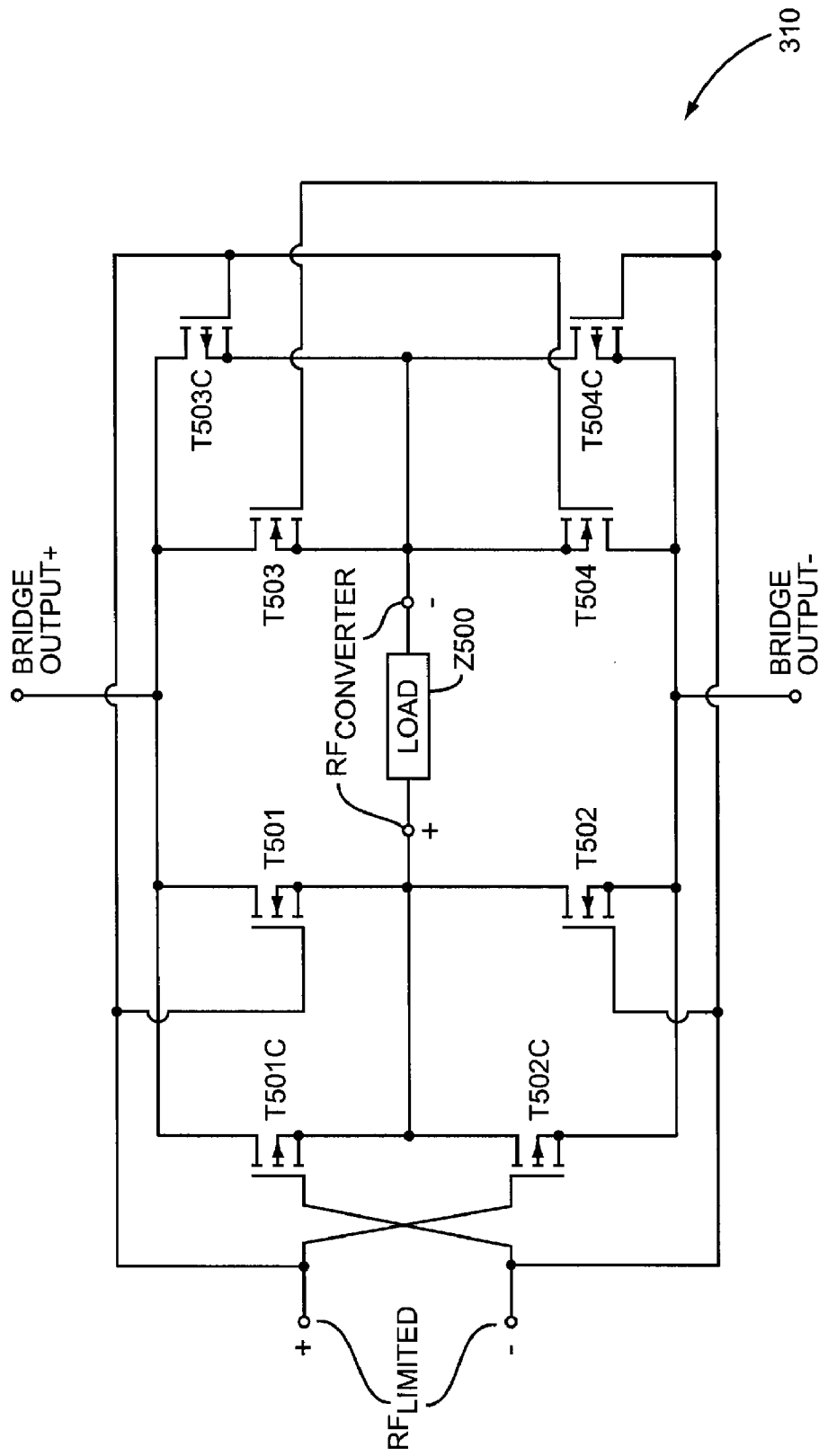
FIG. 5 is a schematic diagram illustrating an exemplary embodiment of a DC-RF converter circuit.

FIG. 5 provides an exemplary schematic for a DC-RF converter 310 according to some embodiments. Those skilled in the art will appreciate, however, that various other circuits may be employed for converting a low-level, low-frequency input current into an RF signal having an amplitude proportional to the input signal level.

The DC-to-RF converter 310 illustrated in FIG. 5 comprises four complementary pairs of transistors, T501-T504 and T501C-T504C, arranged in a passive mixer topology. As noted above, a saturated RF signal may be generated from the original RF input signal, and used as a switching signal in the converter, to convert the bridge output signal into an RF signal across load Z500. In FIG. 5, the switching signal is designated $RF_{LIMITED}$. Alternatively, a distinct local oscillator signal may be generated at another (often lower) frequency, using a simple ring oscillator. The choice of frequency is generally a trade off between technology speed and size of the AC coupling capacitors.

Figure 6:
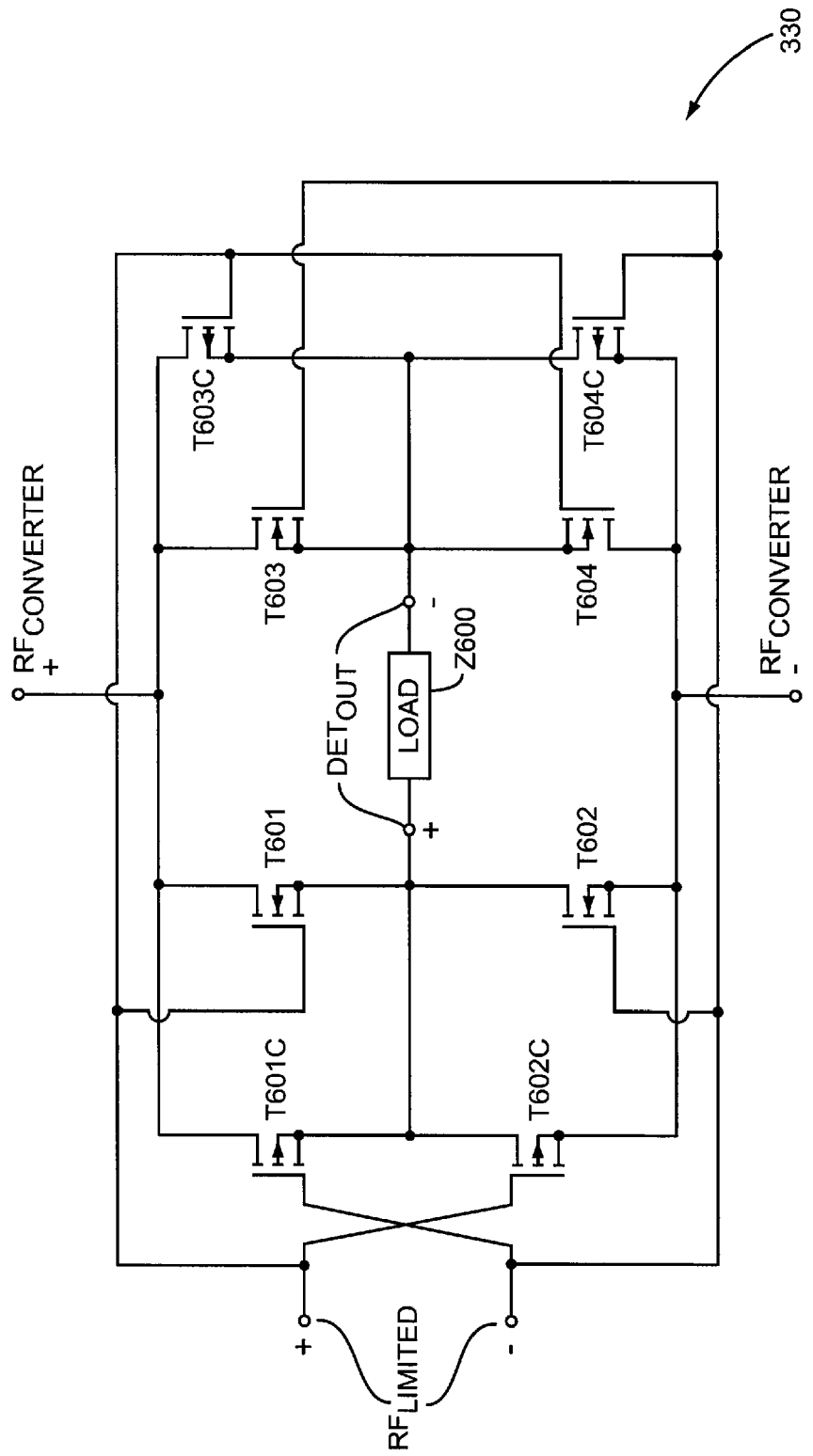
FIG. 6 is a schematic diagram illustrating an exemplary RF rectifier circuit.

FIG. 6 provides an exemplary schematic for a RF rectifier circuit 330 according to some embodiments. Again, those skilled in the art will appreciate that various other circuits may be employed, in this case to convert an RF signal into a DC (or slowly varying) output signal having an amplitude proportional to the RF signal level.

The exemplary RF rectifier circuit 330 illustrated in FIG. 6 also comprises four complementary pairs of transistors, T601-T604 and T601C-T604C, once more arranged in a passive mixer topology. The switching signal, applied to the gates of the complementary transistor pairs, is the same signal used in the DC-RF converter 310, here designated $RF_{LIMITED}$. In the detector circuits illustrated in FIG. 3 and FIG. 4, this switching signal is the same signal applied to DC-RF converter 310, although a different signal, preferably at the same frequency as the signal used to drive DC-RF converter 310, may be used in some embodiments.

Figure 7:
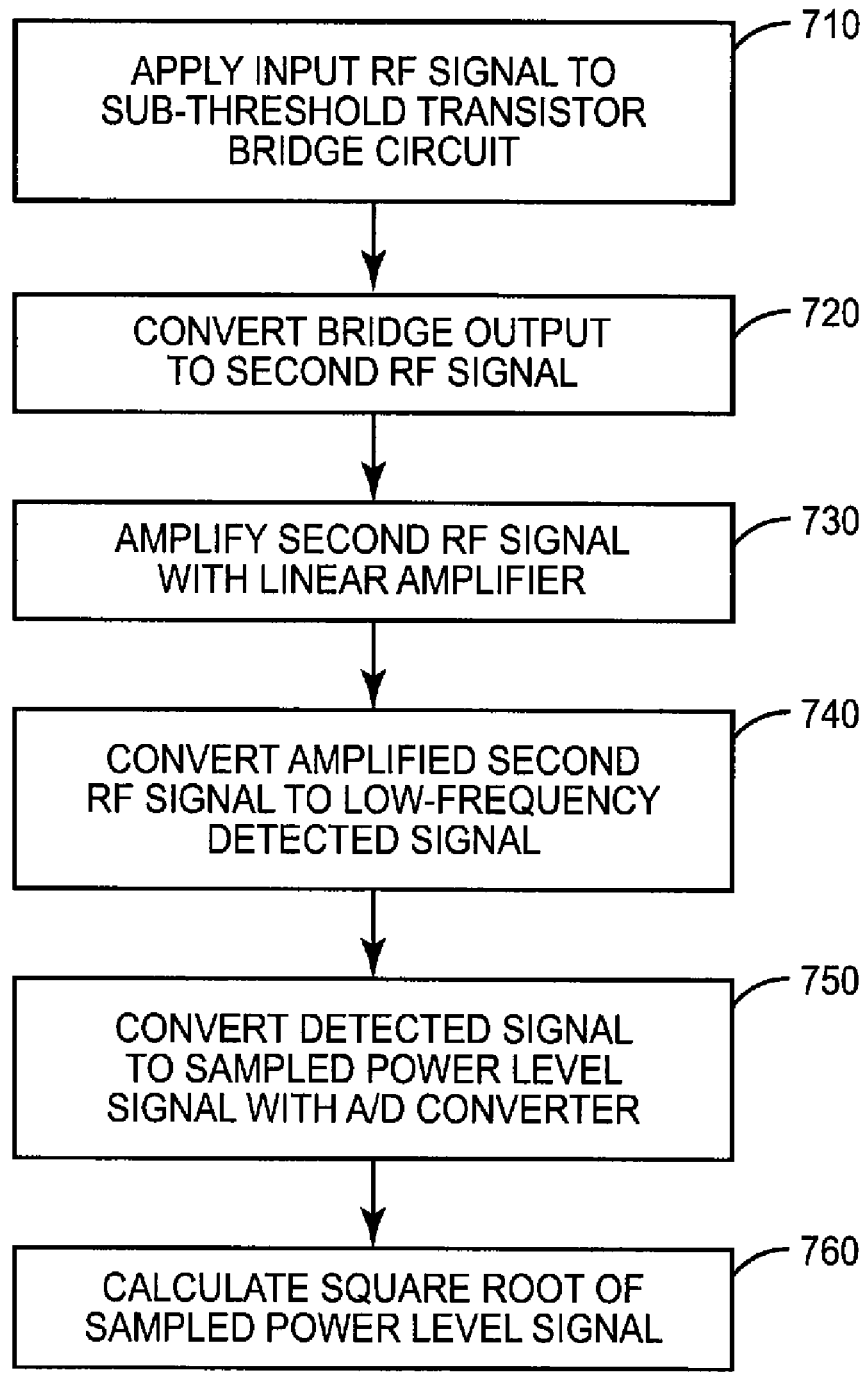
FIG. 7 is a process flow diagram illustrating an exemplary method for detecting a signal level of a radio-frequency signal.

With the above exemplary circuits and their variants in mind, a general method of detecting a signal level of a radio-frequency signal is illustrated in the process flow diagram of FIG. 7. This process flow begins at block 710, with the application of an input RF signal to a first pair of opposing corners of a sub-threshold transistor bridge circuit. As was discussed above in the context of FIGS. 1 and 2, each of the four branches of the sub-threshold bridge circuit comprises a transistor configured for operation in the sub-threshold region, over a pre-determined range of input signal levels. As a result, the bridge output signal at the remaining pair of opposing corners of the bridge has a low-frequency component that is substantially proportional to the squared-amplitude of the envelope of the input radio-frequency signal. In other words, the bridge signal output is dominated by a squared-amplitude component—any DC offset or linear dependency on the input radio-frequency signal level is substantially removed.

As was discussed earlier, the bridge output signal is relatively weak, because the transistors of the bridge circuit are operated in sub-threshold mode. Accordingly, the bridge output is converted to a second RF signal, as shown at block 720, so that it can be amplified to a level more suitable for linear detection. This amplification, performed using a substantially linear radio-frequency amplifier, is shown at block 730. As was discussed above with respect to FIGS. 3 and 4, various circuits may be employed to convert the bridge output signal to an RF signal. In some embodiments, this conversion is performed with a mixer circuit, driven by a switching signal generated by amplifying the input RF signal with a limiting amplifier, to obtain an amplitude-limited radio-frequency. This switching signal, which is generally insensitive to amplitude variations in the RF input signal level, is mixed with the bridge output signal to obtain the second RF signal for amplification.

In other embodiments, the DC-RF conversion illustrated in block 720 is performed using a mixer circuit driven by a separately generated local oscillator signal, having a center frequency that differs from the center frequency of the input radio-frequency signal. In some of these embodiments, the frequency of the second radio-radio frequency signal may be substantially lower than that of the input radio-frequency signal.

After amplification, as shown at block 730, the second RF signal is converted to a low-frequency (DC or near-DC) signal, as shown at block 740. Again, this conversion may be performed using a mixer circuit, which may be driven by the same switching signal used in converting the bridge output signal to the second RF signal. The result of this conversion is a low-frequency detected signal that is proportional to the amplitude of the second RF signal, and thus proportional to the power level of the input RF signal. Finally, the detected signal is converted to a sampled power level signal, using an A/D converter, and an RMS signal computed by taking a square-root of the sampled power level signal. The resulting true RMS signal is thus substantially proportional to the RMS level of the input RF signal.

With the above range of variations and applications in mind, it should be understood that the present invention is not limited by the foregoing description, nor is it limited by the accompanying drawings. Instead, the present invention is limited only by the following claims, and their legal equivalents.

What is claimed is:

1. A detector circuit comprising a sub-threshold transistor bridge circuit, each of the four branches of the bridge circuit comprising a transistor configured to operate in the sub-threshold region over a predetermined range of input signal levels so that an input radio-frequency signal applied to a first pair of opposing corners of the bridge circuit yields a bridge output signal at the remaining pair of opposing corners, the bridge output signal having a low-frequency component substantially proportional to a squared-amplitude of an envelope of the input radio-frequency signal.

2. The detector circuit of claim 1, wherein each of the transistors comprises a field-effect transistor having a low or negligible threshold voltage, and wherein the gate of each field-effect transistor is DC-coupled to the gate of the field-effect transistor on the opposite branch.

3. The detector circuit of claim 1, wherein each of the transistors comprises a field-effect transistor DC-biased for sub-threshold operation, and wherein the gate of each field-effect transistor is AC-coupled to the gate of the field-effect transistor on the opposite branch.

4. The detector circuit of claim 1, further comprising:
  a DC-to-radio-frequency converter circuit configured to convert the bridge output signal to a second radio-frequency signal having an amplitude proportional to the bridge output signal level;
  a radio-frequency amplifier configured to amplify the second radio-frequency signal with a pre-determined gain; and
  a rectifier circuit configured to convert the amplified second radio-frequency signal to a low-frequency detected signal proportional to the envelope of the amplified second radio-frequency signal.

5. The detector circuit of claim 4, wherein the DC-to-radio-frequency converter circuit comprises a frequency mixer circuit configured to mix the bridge output signal with a local oscillator signal to obtain the second radio-frequency signal, the local oscillator signal having a center frequency that differs from the center frequency of the input radio-frequency signal.

6. The detector circuit of claim 4, further comprising a limiting amplifier configured to amplify the input radio-frequency signal to obtain an amplitude-limited radio-frequency signal, wherein the DC-to-radio-frequency converter circuit comprises a frequency mixer circuit configured to mix the bridge output signal with the amplitude-limited radio-frequency to obtain the second radio-frequency signal.

7. The detector circuit of claim 4, further comprising:
  an analog-to-digital converter configured to convert the low-frequency detected signal to a sampled power level signal; and a digital processing circuit configured to calculate the square root of the sampled power level signal to obtain a sampled true root-mean-square signal.

8. A method of detecting a signal level of a radio-frequency signal, the method comprising:
applying an input radio-frequency signal to a first pair of opposing corners of a sub-threshold transistor bridge circuit, each of the four branches of the bridge comprising a transistor configured to operate in the sub-threshold region over a predetermined range of input signal levels so that a bridge output signal at the remaining pair of opposing corners of the bridge has a low-frequency component substantially proportional to a squared-amplitude of an envelope of the input radio-frequency signal; and
detecting a signal level for the input radio-frequency signal based on the bridge output signal.

9. The method of claim 8, wherein detecting a signal level based on the bridge output signal comprises:
converting the bridge output signal to a second radio-frequency signal having an amplitude proportional to the bridge output signal level;
amplifying the second radio-frequency signal according to a pre-determined gain; and
converting the amplified second radio-frequency signal to a low-frequency detected signal proportional to the envelope of the amplified second radio-frequency signal.

10. The method of claim 9, wherein converting the bridge output signal to a second radio-frequency signal comprises mixing the bridge output signal with a local oscillator signal to obtain the second radio-frequency signal, the local oscillator signal having a center frequency that differs from the center frequency of the input radio-frequency signal.

11. The method of claim 9, further comprising amplifying the input radio-frequency signal, using a limiting amplifier, to obtain an amplitude-limited radio-frequency signal, wherein converting the bridge output signal to a second radio-frequency signal comprises mixing the bridge output signal with the amplitude-limited radio-frequency to obtain the second radio-frequency signal.

12. The method of claim 9, further comprising:
converting the low-frequency detected signal to a sampled power level signal, using an analog-to-digital converter; and
calculating the square root of the sampled power level signal to obtain a sampled true root-mean-square signal.

* * * * *

UNITED STATES PATENT AND TRADEMARK OFFICE
CERTIFICATE OF CORRECTION

PATENT NO. : 8,060,040 B2
APPLICATION NO. : 12/193230
DATED : November 15, 2011
INVENTOR(S) : Arnborg It is certified that error appears in the above-identified patent and that said Letters Patent is hereby corrected as shown below:

On Page 2, item (56), under "OTHER PUBLICATIONS", in Column 2, Line 8, delete ""MOS" and insert -- "CMOS --, therefor.

On Page 2, item (56), under "OTHER PUBLICATIONS", in Column 2, Line 11, delete "Logarighmic" and insert -- Logarithmic --, therefor.

Signed and Sealed this
Twenty-first Day of February, 2012

David J. Kappos
*Director of the United States Patent and Trademark Office*